United States Patent
Iseki et al.

(10) Patent No.: US 8,119,242 B2
(45) Date of Patent: Feb. 21, 2012

(54) AMORPHOUS CARBON FILM, PROCESS FOR FORMING AMORPHOUS CARBON FILM, CONDUCTIVE MEMBER PROVIDED WITH AMORPHOUS CARBON FILM, AND FUEL CELL SEPARATOR

(75) Inventors: Takashi Iseki, Aichi-gun (JP); Yuka Yamada, Toyota (JP); Kazuyuki Nakanishi, Seto (JP); Tadashi Oshima, Aichi-gun (JP); Hiroyuki Mori, Nisshin (JP); Toshio Horie, Seto (JP); Ken-ichi Suzuki, Nagoya (JP); Gaku Kitahara, Aichi-gun (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 726 days.

(21) Appl. No.: 12/300,179
(22) PCT Filed: May 22, 2007
(86) PCT No.: PCT/JP2007/060765
§ 371 (c)(1), (2), (4) Date: Nov. 10, 2008
(87) PCT Pub. No.: WO2007/136131
PCT Pub. Date: Nov. 29, 2007

(65) Prior Publication Data
US 2009/0169968 A1 Jul. 2, 2009

(30) Foreign Application Priority Data
May 22, 2006 (JP) ................ 2006-141687

(51) Int. Cl.
*B32B 9/00* (2006.01)
(52) U.S. Cl. ..................... 428/408; 429/492
(58) Field of Classification Search ............... 428/408; 429/492, 481; 252/182.12
See application file for complete search history.

(56) References Cited

U.S. PATENT DOCUMENTS

| 5,198,285 A * | 3/1993 | Arai et al. ............ 428/216 |
| 7,368,168 B2 | 5/2008 | Mori et al. |
| 2005/0142361 A1 | 6/2005 | Kazuyuki et al. |
| 2008/0188383 A1 | 8/2008 | Iseki et al. |

FOREIGN PATENT DOCUMENTS

JP 2000 67881 3/2000
(Continued)

OTHER PUBLICATIONS

Extended Search Report issued Sep. 13, 2010 in European Application No. 07744199.6.

(Continued)

*Primary Examiner* — David Vu
(74) *Attorney, Agent, or Firm* — Oblon, Spivak, McClelland, Maier & Neustadt, L.L.P.

(57) ABSTRACT

The amorphous carbon film of the present invention is an amorphous carbon film comprising carbon and hydrogen, wherein the amorphous carbon film contains not more than 30 atomic % (excluding 0%) of hydrogen and, when the entire amount of the carbon is taken as 100 atomic %, carbon having an $sp^2$ hybrid orbital is present in an amount of not less than 70 atomic % and less than 100 atomic %. Conductivity is imparted to an amorphous carbon film by controlling the contents of hydrogen, $Csp^3$ and the like to increase a structure comprising $Csp^2$. This amorphous carbon film can be formed by plasma CVD using a reaction gas containing one or more gases selected from a carbocyclic compound gas containing carbon having an $sp^2$ hybrid orbital, and a heterocyclic compound gas containing carbon having an $sp^2$ hybrid orbital and silicon and/or nitrogen. By forming the amorphous carbon film on a surface of a substrate, a conductive member can be obtained.

50 Claims, 4 Drawing Sheets

FOREIGN PATENT DOCUMENTS

| | | |
|---|---|---|
| JP | 2002 38268 | 2/2002 |
| JP | 2002 327271 | 11/2002 |
| JP | 2004 14206 | 1/2004 |
| JP | 2004 217977 | 8/2004 |
| JP | 2004 284915 | 10/2004 |
| JP | 2005 93172 | 4/2005 |
| JP | 2005 187318 | 7/2005 |
| WO | WO 2006/057436 A1 | 6/2006 |

OTHER PUBLICATIONS

Uchida, Masao et al., "Temperature Dependence of Conductivity of Nitrogen-Containing Diamondlike Carbon Films Deposited from Pyridine", Jpn. J. Appl. Phys. vol. 35, Part 1, No. 11, pp. 5815-5819, (1996).

Takai, O. et al., "Properties of DLC thin films produced by RF PE-CVD from pyrrole monomer", Surface & Coatings Technology, Elsevier, vol. 200, pp. 1106-1109, (2005).

Yi, Jeong W. et al., "Effects of gas composition and r.f. power on properties of a-C:H/SiC:H composite films grown by plasma-enhanced chemical vapor deposition", Thin Solid Films, vol. 326, pp. 154-159, (1998).

Office Action issued Dec. 15, 2011, in Japanese Application No. 2007-135777 (w/ English translation).

* cited by examiner

AMORPHOUS CARBON FILM, PROCESS FOR FORMING AMORPHOUS CARBON FILM, CONDUCTIVE MEMBER PROVIDED WITH AMORPHOUS CARBON FILM, AND FUEL CELL SEPARATOR

TECHNICAL FIELD

The present invention relates to an amorphous carbon film having carbon as a major component and exhibiting conductivity, a process for forming the same, and a conductive member provided with an amorphous carbon film, as typified by a fuel cell separator.

BACKGROUND ART

Owing to its almost unlimited resources and harmlessness, carbon is an excellent material in view of resources and environmental problems. Carbon materials have diverse forms of interatomic bonding, and a variety of crystal structures are known, such as diamond, diamond-like carbon, graphite, fullerene and carbon nanotubes. Above all, diamond-like carbon (amorphous carbon) having an amorphous structure is expected to be applied in each industrial field, because of its high mechanical strength and superior chemical stability.

However, general amorphous carbon films have an electric resistance in the range of semiconductors to insulators. In order to further widen the use of amorphous carbon, it has been requested to impart electric conductivity to amorphous carbon. One use of amorphous carbon is a fuel cell separator. FIG. 8 schematically shows one example of a single-cell solid polymer fuel cell. The left figure of FIG. 8 shows arrangement of its respective constituent elements before lamination, and the right figure of FIG. 8 shows a laminated state of those elements. A single cell 1 is constituted by an electrolyte membrane 1*a*, and a pair of electrodes (an air electrode 1*b* and a fuel electrode 1*c*) sandwiching the electrolyte membrane 1*a* from both sides. Separators 2 having channel-formed surfaces 2*b*, 2*c* on which a plurality of channels are formed. The separators 2 are respectively set in resin separator frames 3 and laminated so that the air electrode 1*b* and the channel-formed surface 2*b* face each other and the fuel electrode 1*c* and the channel-formed surface 2*c* face each other. Thus, gas passages sectioned by electrode surfaces and the channels are formed between the electrodes and the separators, and fuel gas and oxygen gas, which are reaction gases of the fuel cell, are efficiently supplied to the electrode surfaces.

In the fuel cell, the fuel gas and the oxygen gas need to be separately supplied to the entire electrode surfaces without being mixed. Therefore, the separators need to be gas tight. Furthermore, the separators need to collect electrons generated by a reaction and to have a good conductivity as electric connectors for connecting adjoining single cells when a plurality of cells are laminated. Moreover, because electrolyte surfaces are strongly acidic, the separators are demanded to have corrosion resistance.

Therefore, as a separator material, it is common to use graphite plates. However, because the graphite plates split easily, the graphite plates have a problem in workability in producing separators by forming a plurality of gas passages, making the surfaces flat and so on. On the other hand, because metallic materials are superior in both conductivity and workability and especially titanium and stainless steel have superior corrosion resistance, the metallic materials can be used as separator materials. However, since metallic materials having superior corrosion resistance are easily passivated, there is a problem of increasing internal resistance of a fuel cell and causing a voltage drop. Consequently, a separator in which a surface of a metallic substrate is covered with a conductive amorphous carbon film starts to attract attention.

Examples of a process for imparting conductivity to amorphous carbon include a process of adding a metal to amorphous carbon (see Japanese Unexamined Patent Publication No. 2002-38268 (Patent Document 1) and Japanese Unexamined Patent Publication No. 2004-284915 (Patent Document 2)). However, the added metal may become a cause of corrosion and the metal-added amorphous carbon when used in contact with other metals may become a cause of adhesion, so chemical stability which amorphous carbon inherently has is sometimes damaged.

On the other hand, in Patent Document 3, conductivity is imparted to amorphous carbon without adding metal. Patent Document 3 discloses a carbon film having a structure in which an $sp^2$-bonded crystal having $sp^2$-bonded carbon within part of the crystal extends continuously from the lowermost layer (a substrate side) to the uppermost layer (a surface side) of the film in a film thickness direction and other portions than the $sp^2$-bonded crystal are amorphous. According to the description of Patent Document 3, it is important in view of corrosion resistance and wear resistance of the carbon film to reduce the content of $sp^2$-bonded crystal. Therefore, it is desirable that the $sp^2$-bonded crystal exists continuously from the substrate side to the surface side of the carbon film, because it is effective in increasing conductivity in a film thickness direction of the carbon film and as a result contributes to reducing the content of $sp^2$-bonded crystal. The cited document 3 also states that an increase in the content of the $sp^2$-bonded crystal causes a decrease in hardness and a decrease in wear resistance of the carbon film. That is to say, the cited document 3 suggests that an amorphous portion of the carbon film contains a large amount of $sp^3$-bonded carbon, which improves wear resistance and hardness. As a result, there is a possibility that conductivity in a perpendicular direction to the film thickness direction in which there is no continuous $sp^2$-bonded crystal deteriorates and that electrical anisotropy occurs.

Moreover, Japanese Unexamined Patent Publication No. 2000-67881 (Patent Document 4) and Japanese Unexamined Patent Publication No. 2005-93172 (Patent Document 5) disclose a fuel cell separator in which an amorphous carbon film mainly comprising carbon and hydrogen is formed on a surface of a metallic material, using methane as a raw material. However, it is assumed that the separators of Patent Document 4 and Patent Document 5 having an amorphous carbon film formed by an ordinary film-forming process using methane as a raw material do not have sufficient conductivity or corrosion resistance required for separators. Especially in Patent Document 4 and Patent Document 5, characteristics were not evaluated under severe conditions where a voltage expected in actual environment was applied to the separators, so it is believed that the separators when used in fuel cells do not exhibit required conductivity or corrosion resistance.

DISCLOSURE OF INVENTION

The present invention has been made in consideration of these actual situations, and it is an object of the present invention to provide an amorphous carbon film having conductivity without deteriorating characteristics which amorphous carbon inherently has. It is also an object of the present invention to provide a process for forming such an amorphous carbon film, and a conductive member provided with an amorphous carbon film such as a fuel cell separator.

An amorphous carbon film of the present invention is an amorphous carbon film comprising carbon and hydrogen and characterized in that the amorphous carbon film contains not more than 30 atomic % (excluding 0 atomic %) of hydrogen and, when the entire amount of the carbon is taken as 100 atomic %, carbon having an $sp^2$ hybrid orbital is present in an amount of not less than 70 atomic % and less than 100 atomic %.

It is preferable that the amorphous carbon film of the present invention further contains not more than 20 atomic % (excluding 0 atomic %) of nitrogen. It is also preferable that the amorphous carbon film of the present invention further contains not more than 5 atomic % (excluding 0 atomic %) of silicon in addition to nitrogen.

An amorphous carbon film of the present invention is an amorphous carbon film comprising carbon, hydrogen and silicon and characterized in that the amorphous carbon film contains not more than 30 atomic % (excluding 0 atomic %) of hydrogen and less than 1 atomic % (excluding 0 atomic %) of silicon and, when the entire amount of the carbon is taken as 100 atomic %, carbon having an $sp^2$ hybrid orbital is present in an amount of not less than 70 atomic % and less than 100 atomic %.

In the description of the present invention, carbon which makes an $sp^2$ hybrid orbital to bond will be hereinafter referred to as "carbon having an $sp^2$ hybrid orbital" or "$Csp^2$". Likewise, carbon which makes an $sp^3$ hybrid orbital to bond will be referred to as "carbon having an $sp^3$ hybrid orbital" or "$Csp^3$".

Depending on a difference in atomic orbital in chemical bonding, there are three types of carbon atoms: carbon having an sp hybrid orbital (Csp), carbon having an $sp^2$ hybrid orbital ($Csp^2$), and carbon having an $sp^3$ hybrid orbital ($Csp^3$). For example, diamond, which is composed of $Csp^3$ only, forms σ bonds only and exhibits high insulation properties due to localization of σ electrons. On the other hand, graphite is composed of $Csp^2$ only and forms σ bonds and π bonds and exhibits high conductivity due to delocalization of π electrons.

The present inventors have earnestly studied amorphous carbon films having carbon as a main component and have found that conductivity can be imparted to an amorphous carbon film by controlling the contents of hydrogen, $Csp^3$ and the like to increase a structure comprising $Csp^2$.

That is to say, in the amorphous carbon film of the present invention, delocalization of π electrons is promoted by a high ratio of $Csp^2$ in the entire carbon and molecular termination by C—H bonds (σ bonds) is suppressed by reducing the hydrogen content. As a result, the amorphous carbon film of the present invention exhibits high conductivity. Moreover, the amorphous carbon film of the present invention does not exhibit such electrical anisotropy as single-crystal graphite exhibits, because it is amorphous.

Moreover, an amorphous carbon film forming process of the present invention is a process for forming the abovementioned amorphous carbon film of the present invention on a surface of a substrate by plasma CVD, and which is characterized in placing the substrate in a reaction vessel; introducing, into the reaction vessel, a reaction gas containing one or more gases selected from the group consisting of a carbocyclic compound gas containing carbon having an $sp^2$ hybrid orbital and a heterocyclic compound gas containing carbon having an $sp^2$ hybrid orbital and silicon and/or nitrogen; and discharging electricity.

According to the amorphous carbon film forming process of the present invention, by using, as a raw material, a reaction gas containing a carbocyclic compound gas and/or a heterocyclic compound gas having a ring structure and containing carbon having an $sp^2$ hybrid orbital, it becomes possible to easily form an amorphous carbon film having a ratio of $Csp^2$ in the entire carbon of not less than 70 atomic % and a small hydrogen content. Therefore, the present forming process is suitable as a process for forming the abovementioned amorphous carbon film of the present invention. Furthermore, the present forming process can easily form the abovementioned amorphous carbon film of the present invention at a practical film-forming rate.

Moreover, the amorphous carbon film of the present invention is suitable as a conductive member, especially as a fuel cell separator. That is to say, a conductive member of the present invention is characterized in comprising a substrate, and the abovementioned amorphous carbon film of the present invention formed on at least part of the substrate.

Moreover, a fuel cell separator of the present invention is a fuel cell separator, comprising a metallic substrate and an amorphous carbon film covering at least a surface of the substrate facing an electrode, and characterized in that the amorphous carbon film is the abovementioned amorphous carbon film of the present invention.

The conductive member of the present invention is provided with the abovementioned amorphous carbon film of the present invention. The amorphous carbon film of the present invention has not only high conductivity but also wear resistance, solid lubricating properties, corrosion resistance and so on which amorphous carbon inherently has. Therefore, the conductive member of the present invention is suitable for members such as a member which conducts electricity when brought in contact, and a fuel cell separator used in corrosive environments and demanded to have high conductivity.

BEST MODE FOR CARRYING OUT THE INVENTION

Next, referring to embodiments, the amorphous carbon film, the amorphous carbon film forming process, the conductive member provided with the amorphous carbon film, and the fuel cell separator of the present invention will be described in more detail.

[Amorphous Carbon Film]

An amorphous carbon film of the present invention is an amorphous carbon film comprising carbon and hydrogen, wherein the amorphous carbon film contains not more than 30 atomic % (excluding 0 atomic %) of hydrogen and, when the entire amount of the carbon is taken as 100 atomic %, $Csp^2$ is present in an amount of not less than 70 atomic % and less than 100 atomic %.

Examples of a method for quantitatively determining $Csp^2$ and $Csp^3$ include Raman scattering spectroscopy, infrared spectroscopy (FT-IR), and X-ray photoelectron spectroscopy (XPS). For example, a method has been introduced which utilizes Raman scattering spectroscopy using a visible-light source and determines a quantitative ratio of $Csp^3$ to $Csp^2$ from a ratio of an intensity of the D band around 1,350 $cm^{-1}$ to that of the G band around 1,580 $cm^{-1}$ "I(D)/I(G)". However, a recent study ("MATERIALS SCIENCE & ENGINEERING R-REPORTS 37 (4-6) p. 129 2002") has shown that in the D band, sensitivity of $Csp^3$ is from 1/50 to 1/260 of that of $Csp^2$. Hence, it is not possible to discuss the quantity of $Csp^3$ using Raman scattering spectroscopy. On the other hand, the general interpretation ("Applied Physics Letters 60, p. 2089 1992") is that using FT-IR, C—H bonds around 2,900 $cm^{-1}$ can be evaluated qualitatively but $Csp^2$ and $Csp^3$ cannot be quantitatively determined. Meanwhile, using XPS, it is not always impossible to determine a provisional quantitative ratio of $Csp^2$ to $Csp^3$ by separating peaks of C=C bonds and C—C bonds in terms of bond energy of $C_{1s}$. However, the difference between the above two bond energies is small, and most of the peaks appear as mono-modal peaks. Consequently, it is quite inevitable that the peak separation is carried out arbitrarily. Moreover, an analyzable range by XPS is limited to a depth of about a few nanometers from the outermost surface from which photoelectrons can escape. Because the outermost surface is likely to be affected by dangling bonds or oxidation, the structure of the outermost surface differs from the inner structure. Accordingly, it is a big problem to identify the structure of the entire film with that of the outermost surface. In order to know the inner structure of a film, a method is available in which an XPS spectrum is obtained in situ while applying argon ion sputtering. However, even using this method, it is not always possible to grasp the true structure of the film, because the ion bombardment can change the inner structure.

Figure 1:
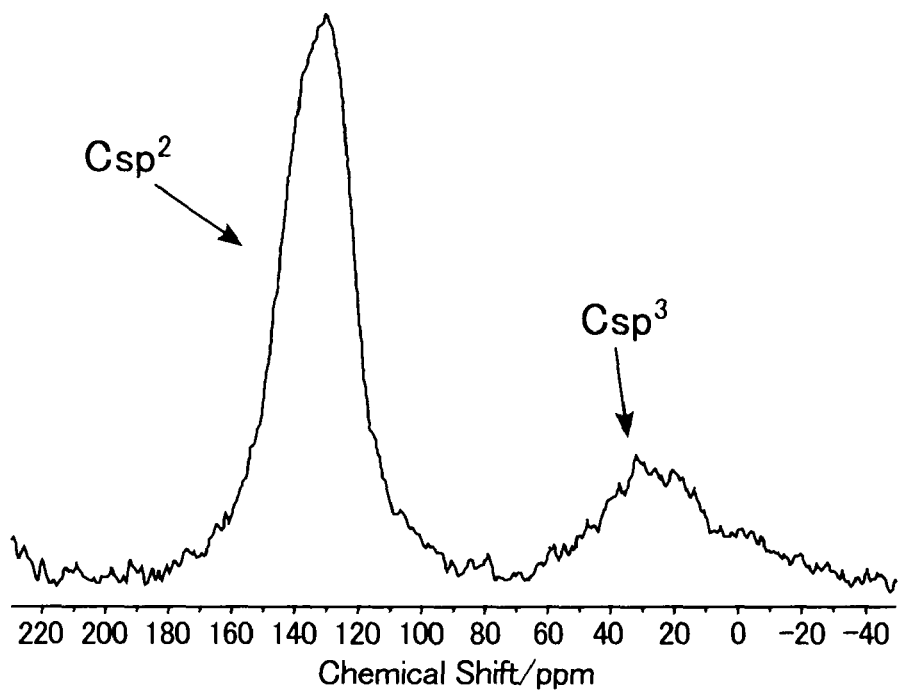
FIG. 1 shows an example of a $^{13}C$ NMR spectrum of an amorphous carbon film.

As mentioned above, using the aforementioned methods, $Csp^2$ and $Csp^3$ cannot be quantitatively determined with accuracy. Therefore, in the description of the present invention, as a method for quantitatively determine $Csp^2$ and $Csp^3$, a nuclear magnetic resonance (NMR) method is employed which has the highest quantitative determination ability in the structural identification of many organic and inorganic materials. Used for quantitatively determining $Csp^2$ and $Csp^3$ was high-power decoupling with magic angle spinning (HD-MAS), which has a high quantitative determination ability in solid-state NMR. FIG. 1 shows an example of a $^{13}C$ NMR spectrum of an amorphous carbon film. As shown in FIG. 1, peaks attributed to $Csp^2$ and $Csp^3$ are respectively observed around 130 ppm and around 30 ppm. A ratio of the $Csp^2$ content and the $Csp^3$ content in the entire carbon was calculated from a ratio in areas of portions surrounded by the respective peaks and a baseline.

The amount of $Csp^2$ of the amorphous carbon film of the present invention calculated in the abovementioned method is not less than 70 atomic % and less than 100 atomic % when the entire amount of carbon is taken as 100 atomic %. When $Csp^2$ is present in an amount of not less than 70 atomic %, delocalization of π electrons is promoted and high conductivity is exhibited. However, when $Csp^2$ is present in an amount of 100 atomic %, conductivity is obtained but carbon becomes powdery and a dense film cannot be obtained. It is preferable that $Csp^2$ of the amorphous carbon film of the present invention is present in an amount of not less than 75 atomic %, not less than 80 atomic % or not less than 85 atomic %, and not more than 99.5 atomic % or not more than 99 atomic %. It is noted that carbon constituting the amorphous carbon film of the present invention is believed to be composed of two types of carbon, namely, $Csp^2$ and $Csp^3$. Therefore, $Csp^3$ of the amorphous carbon film of the present invention is present in an amount of not more than 30 atomic % (excluding 0 atomic %) when the entire amount of carbon is taken as 100 atomic %.

It is noted that an amorphous carbon film containing not less than 70 atomic % of $Csp^2$ like the amorphous carbon film of the present invention can be formed by plasma CVD using, as a raw material, a reaction gas containing one or more gases selected from a carbocyclic compound gas containing $Csp^2$ and a heterocyclic compound gas containing $Csp^2$ and an additional element except carbon and oxygen. If a gaseous compound not containing $Csp^2$ is used as a raw material, it is difficult to form an amorphous carbon film in which $Csp^2$ is present in an amount of not less than 70 atomic %.

The hydrogen (H) content of the amorphous carbon film of the present invention is not more than 30 atomic % (excluding 0 atomic %). Because molecular termination by C—H bonds (σ bonds) is suppressed by reducing the H content, π electrons are increased and high conductivity is exhibited. Therefore, as the amorphous carbon film of the present invention has a smaller H content, an effect of enhancing conductivity is greater. Accordingly, it is preferable that the H content is not more than 25 atomic %, less than 20 atomic % or less than 18 atomic %. Moreover, conductivity increases with a decrease in the H content, but if the H content is to be defined, the H content may be not less than 5 atomic %, not less than 10 atomic % or not less than 13 atomic %.

The amorphous carbon film of the present invention can further contain nitrogen. That is to say, an amorphous carbon film of the present invention is an amorphous carbon film comprising carbon, hydrogen and nitrogen, wherein the amorphous carbon film contains not more than 30 atomic % (excluding 0 atomic %) of hydrogen and not more than 20 atomic % (excluding 0 atomic %) of nitrogen and, when the entire amount of the carbon is taken as 100 atomic %, $Csp^2$ is present in an amount of not less than 70 atomic % and less than 100 atomic %. Because a nitrogen atom serves as an n-type donor in the amorphous carbon film and effectively excites an electron trapped in a donor level to a conduction band, conductivity of the amorphous carbon film is further enhanced.

The nitrogen (N) content of the amorphous carbon film of the present invention is not more than 20 atomic % (excluding 0 atomic %). If the N content is high, molecular termination is promoted by formation of C≡N bonds. Therefore, the N content is suppressed to not more than 20 atomic %. It is preferable that the N content of the amorphous carbon film of the present invention is not less than 2 atomic %, not less than 3 atomic % or not less than 4 atomic %, and not more than 18 atomic %, not more than 15 atomic % or not more than 10 atomic %.

The amorphous carbon film of the present invention can further contain silicon. That is to say, an amorphous carbon film of the present invention is an amorphous carbon film comprising carbon, hydrogen and silicon, wherein the amorphous carbon film contains not more than 30 atomic % (excluding 0 atomic %) of hydrogen and less than 1 atomic % (excluding 0 atomic %) of silicon and, when the entire amount of the carbon is taken as 100 atomic %, $Csp^2$ is present in an amount of not less than 70 atomic % and less than 100 atomic %. Or, an amorphous carbon film of the present invention is an amorphous carbon film comprising carbon, hydrogen, nitrogen and silicon, wherein the amorphous carbon film contains not more than 30 atomic % (excluding 0 atomic %) of hydrogen, not more than 20 atomic % (excluding 0 atomic %) of nitrogen, and not more than 5 atomic % (excluding 0 atomic %) of silicon and, when the entire amount of the carbon is taken as 100 atomic %, $Csp^2$ is present in an amount of not less than 70 atomic % and less than 100 atomic %.

In the amorphous carbon film of the present invention, not more than 5 atomic % of silicon (Si) hardly affects conductivity of the amorphous carbon film, but increases density of the amorphous carbon film and improves adhesion between the amorphous carbon film and a substrate. It is preferable that the Si content of the amorphous carbon film of the present invention is not less than 0.5 atomic % or not less than 0.6 atomic %, and not more than 3 atomic % or less than 1 atomic %.

As mentioned above, it is desirable that the amorphous carbon film of the present invention comprises hydrogen, or hydrogen and nitrogen and/or silicon with the balance being carbon and inevitable impurities, and substantially does not contain other elements, but, when the entire amorphous carbon film is taken as 100 atomic %, the amorphous carbon film can further contain not more than 3 atomic % of oxygen (O). If the oxygen content, which results from oxygen gas mixed in forming the amorphous carbon film, is controlled to not more than 3 atomic %, formation of oxides such as silicon oxide can be suppressed, so oxygen inclusion is permitted. Preferably the O content is not more than 2 atomic % or not more than 1 atomic %.

The present invention is an amorphous carbon film having carbon as a main component. This can be confirmed by powdering the amorphous carbon film of the present invention and carrying out X-ray diffraction (XRD) analysis. According to the XRD analysis, sharp diffraction peaks which indicate existence of crystals are not detected and diffraction peaks corresponding to (002) planes of graphite have broad halo patterns.

In this case, it is preferable that a mean interplanar spacing of (002) planes calculated from Bragg's law is from 0.34 to 0.50 nm inclusive. When the mean interplanar spacing of (002) planes is not more than 0.50 nm, owing to the small interplanar spacing, interaction of π electrons between the planes is enhanced and conductivity is improved. It is noted that graphite has a mean interplanar spacing of (002) planes of 0.34 nm. It is more preferable that the mean interplanar spacing of (002) planes is from 0.34 to 0.45 nm or from 0.34 to 0.40 nm.

It is noted that "having conductivity" in the description of the present invention means to exhibit a volume resistivity of not more than $10^2$ Ω·cm. Conductivity of the amorphous carbon film of the present invention is not particularly limited, but it is preferable that volume resistivity is not more than $10^2$ Ω·cm or not more than $10^1$ Ω·cm. Especially an amorphous carbon film having a volume resistivity of not more than $10^{-1}$ Ω·cm is suitable for a fuel cell separator, which will be mentioned later.

[Process for Forming an Amorphous Carbon Film]

The amorphous carbon film of the present invention can be formed by already known CVD processes and PVD processes such as plasma CVD, ion plating and sputtering. However, in PVD processes as typified by sputtering, film formation has directivity. Hence, in order to form a uniform film, it is necessary to take measures such as placing a plurality of targets in a device or rotating a substrate on which a film is to be formed. As a result, a film-forming device gets complicated in structure and costly. Moreover, film formation is sometimes difficult, depending on the shape of a substrate. On the other hand, in plasma CVD, a uniform film can be formed regardless of the shape of a substrate, because the film is formed by a reaction gas. Its film-forming device is also simple in structure and inexpensive.

When the amorphous carbon film of the present invention is formed by plasma CVD, first a substrate is placed in a vacuum vessel and a reaction gas and a carrier gas are introduced. Next, plasma is generated by discharging electricity so as to deposit on the substrate. It is noted that in order to form an amorphous carbon film having a high ratio of $Csp^2$ in the entire carbon and a small hydrogen content, such as the amorphous carbon film of the present invention, it is necessary to select and use such a reaction gas as mentioned later.

Examples of plasma CVD include high frequency plasma CVD using high frequency discharge, microwave plasma CVD using microwave discharge and DC plasma CVD using direct current discharge. Above all, DC plasma CVD is suitable. According to DC plasma CVD, a film-forming device can be constituted by a vacuum furnace and a DC power source and films can easily be formed on variously-shaped substrates. Moreover, if the reaction gas has a high concentration and film-forming pressure is not less than 100 Pa, stable electric discharge can be obtained.

An amorphous film forming process of the present invention will be hereinafter described as a preferred embodiment using plasma CVD. An amorphous carbon film forming process of the present invention comprises placing a substrate in a reaction vessel; introducing, into the reaction vessel, a reaction gas containing one or more gases selected from the group consisting of a carbocyclic compound gas containing carbon having an $sp^2$ hybrid orbital and a heterocyclic compound gas containing carbon having an $sp^2$ hybrid orbital and silicon and/or nitrogen; and discharging electricity. It is noted that it is possible to grasp this process also as processes for producing a conductive member and a fuel cell separator of the present invention, which will be mentioned later.

As the substrate, it is possible to use a material selected from metal, semiconductor, ceramic, resin and so on. Examples of the material include a metallic substrate such as iron or iron-based alloys such as carbon steel, alloy steel and cast iron, aluminum or aluminum alloys, titanium or titanium alloys, and copper or copper alloys; a semimetallic substrate such as silicon; a ceramic substrate such as hard metal, silica, alumina and silicon carbide; and a resin substrate such as polyimide, polyamide and polyethylene terephthalate.

Moreover, from the viewpoint of improving adhesion between the substrate and the amorphous carbon film, it is advisable to apply a treatment to a surface of the substrate for forming roughness by means of ion bombardment in advance. Specifically, first, a substrate is placed in a vessel, and gases in the vessel are evacuated to a predetermined gas pressure. Next, a rare gas for forming roughness is introduced into the vessel. Next, ion bombardment is carried out by glow discharge or ion beam, thereby forming roughness on a surface of the substrate. Moreover, in order to form uniform and fine roughness on the surface of the substrate, it is advisable to apply nitriding treatment before the treatment for forming unevenness. Examples of the method of nitriding treatment include gas nitriding, salt bath nitriding and ion nitriding.

As the reaction gas, one or more gases selected from the group consisting of a carbocyclic compound gas containing $Csp^2$ and a heterocyclic compound gas containing $Csp^2$ and Si and/or N. It is noted that "a carbocyclic compound" is a cyclic compound in which all atoms constituting a ring are carbon atoms. In contrast, "a heterocyclic compound" is a cyclic compound in which a ring is constituted by two or more kinds of atoms. Examples of a carbocyclic compound containing $Csp^2$, in other words, a carbocyclic compound having a carbon-carbon double bond include not only an aromatic hydrocarbon compound such as benzene, toluene, xylene and naphthalene but also cyclohexene. Moreover, when an amorphous carbon film containing silicon and/or nitrogen is formed, it is possible to use a carbocyclic compound containing Si and/or N along with $Csp^2$ and its examples include an N-containing aromatic compound such as aniline and azobenzene, and an Si-containing aromatic compound such as phenylsilane and phenylmethylsilane. Among these examples, especially benzene, toluene and xylene are suitable. The carbocyclic compound can be one or more selected from these. Moreover, in DC plasma CVD, because plasma density is relatively small, it is believed that the reaction gas is less likely to decompose. Hence, in DC plasma CVD, it is effective in increasing $Csp^2$ in the amorphous carbon film to use, as a reaction gas, benzene gas or the like having a low dissociation energy. When an amorphous carbon film containing silicon and/or nitrogen is formed, it is advisable to use a heterocyclic compound containing $Csp^2$ and Si and/or N. Examples of the heterocyclic compound include a nitrogen-containing heterocyclic compound such as pyridine, pyrazine, pyrrole, imidazole, and pyrozole, in which a ring is constituted by carbon and nitrogen. The heterocyclic compound can be one or more selected from these. It is possible to use any one kind of these carbocyclic compound gas and heterocyclic compound gas singly, or two or more kinds of them by mixing.

When a silicon-containing amorphous carbon film is formed, as the reaction gas it is possible not only to use a heterocyclic compound gas containing $Csp^2$ and Si, but also to use a silicon compound gas such as $Si(CH_3)_4$[TMS], $Si(CH_3)_3H$, $Si(CH_3)_2H_2$, $Si(CH_3)H_3$, $SiH_4$, $SiCl_4$ and $SiH_2F_4$ by mixing with a carbocyclic compound gas. Especially TMS is suitable because it is chemically stable in the air and easy to handle.

When a nitrogen-containing amorphous carbon film is formed, as the reaction gas it is possible not only to use a heterocyclic compound gas containing $Csp^2$ and N, but also to use nitrogen gas or nitrogen compound gas such as ammonia, methylamine, dimethylamine and trimethylamine by mixing with a carbocyclic compound gas.

Moreover, a carrier gas can be introduced along with the reaction gas. When a carrier gas is used, the reaction gas and the carrier gas form an atmosphere for forming a thin film. As the carrier gas, hydrogen gas, argon gas or the like may be used as mentioned above. The kinds and flow ratio of the reaction gas and the carrier gas can be appropriately selected so that a resulting amorphous carbon film obtains a desired composition. For example, it is suitable to introduce the carrier gas at 1 to 1000 sccm (standard cc/min), the abovementioned carbocyclic compound gas at 1 to 500 sccm, the abovementioned heterocyclic compound at 1 to 500 sccm, and one or more gases selected from silicon compound gas, nitrogen gas and nitrogen compound gas at 0.1 to 100 sccm.

Pressure of the atmosphere for forming a thin film is not less than 1 Pa and not more than 1300 Pa. It is suitable that the pressure is not less than 100 Pa and not more than 1000 Pa, or not less than 300 Pa and not more than 800 Pa. If film-forming pressure is increased, concentration of the reaction gas is increased. Hence, the film-forming speed becomes higher and a thick film can be formed at a practical speed.

Surface temperature of the substrate during forming an amorphous carbon film (film-forming temperature) is not particularly limited, but desirably not less than 450° C., not less than 500° C., or not less than 550° C. As the film-forming temperature is raised, the hydrogen content of the amorphous carbon film is reduced and conductivity is improved. However, if the film-forming temperature becomes too high, density of the film is decreased and the substrate becomes susceptible to corrosion. Besides, a reaction product of a component of the substrate and carbon is sometimes generated at the boundaries of the substrate and the amorphous carbon film. For example, if a titanium substrate is used, TiC is generated at the boundaries. Since TiC is susceptible to corrosion, corrosion resistance of a resulting conductive member may be decreased. Therefore, desirably the film-forming temperature is not more than 700° C. If it is desired to obtain an amorphous carbon film having a greatly reduced hydrogen content, it is desirable that the film-forming temperature is not less than 600° C. or not less than 625° C.

Moreover, voltage in discharging electricity is not particularly limited, but desirably not less than 200 V or not less than 250 V. If the film-forming temperature is not less than 450° C. or not less than 500° C., even if electricity is discharged at a voltage of not more than 500 V or not more than 400 V, the hydrogen content of a resulting amorphous carbon film is reduced. On the other hand, if the voltage is increased, because decomposition of the reaction gas is promoted, the hydrogen content of the amorphous carbon film is reduced. Therefore, even if the film-forming temperature is less than 500° C. or less than 450° C., the hydrogen content of the amorphous carbon film is reduced by discharging electricity at a high voltage of not less than 1000 V or not less than 2000 V. Especially, when the reaction gas contains a nitrogen-containing aromatic compound, the hydrogen content of the amorphous carbon film is reduced and conductivity is improved by the addition of nitrogen, by discharging electricity at not less than 1000 V or not less than 2000 V. Moreover, an amorphous carbon film produced under these conditions is hard and dense and has few defects.

[Conductive Member Provided with Amorphous Carbon Film]

A conductive member of the present invention comprises a substrate and the abovementioned amorphous carbon film of the present invention formed on at least part of the substrate.

As for the substrate, description is already given in the section of [Process for Forming an Amorphous Carbon Film]. By being formed on a non-conductive substrate, the amorphous carbon film can impart conductivity to a portion where the amorphous carbon film is formed, or by being formed on a surface of a conductive substrate, the amorphous carbon film can impart corrosion resistance, wear resistance, solid lubricating properties and the like to the substrate without damaging conductivity which the substrate has. For example, taking advantage of conductivity and corrosion resistance which the amorphous carbon film has, the conductive member of the present invention can be used not only as a fuel cell separator, which will be mentioned in detail later, but also as materials for various kinds of electrodes such as an electrode for plating and a battery electrode. Moreover, taking advantage of conductivity and sliding properties which the amorphous carbon film has, the conductive member of the present invention can be used not only as a contact point member such as a switch contact point, a key contact point and a sliding contact point but also a plug electrode and the like.

[Fuel Cell Separator]

A fuel cell separator of the present invention comprises a metallic substrate and an amorphous carbon film covering at least a surface of the substrate facing an electrode. Generally, the fuel cell separator has a surface which partly contacts an electrode laminated on a solid electrolyte and forms sectioned gas passages in a space formed with the electrode. By covering a surface of a metallic substrate with the abovementioned amorphous carbon film of the present invention, conductivity and corrosion resistance required for a fuel cell separator can be exhibited.

The fuel cell separator of the present invention is applicable to a general fuel cell. The general fuel cell has a single cell constituted by a solid electrolyte and a pair of electrodes sandwiching the solid electrolyte from both sides. Each of the electrodes comprises a catalyst layer having metal catalyst-loaded carbon powder as a main component and formed on a surface of the polymer electrolyte membrane, and a gas diffusion layer located on an outer surface of the catalyst layer and having gas permeability and conductivity. The carbon powder constituting the catalyst layer is loaded with a catalyst such as platinum, nickel and palladium. Moreover, as the gas diffusion layer, carbon fiber woven fabric cloth (carbon cloth) or carbon fiber nonwoven fabric (carbon paper) is generally used.

Preferably the substrate of the separator is formed of a conductive metallic material having a low electric resistance (about not more than $10^{-3}$ Ω·cm in terms of volume resistivity). Also preferably, the substrate of the separator is formed of a metallic material having high corrosion resistance. Furthermore, it is advisable that the substrate of the separator is formed of a material which gas is difficult to permeate. Concrete examples of the metallic material include pure titanium or titanium alloys, aluminum or aluminum alloys, copper or copper alloys, stainless steel, high speed steel, and nickel alloys. The shape of the substrate can be appropriately selected in accordance with specifications of a fuel cell.

As the amorphous carbon film which covers the substrate, it is advisable to employ the amorphous carbon film of the present invention, which have already been explained. Then, a separator superior in both conductivity and corrosion resistance can be obtained. Especially, the amorphous carbon film of the present invention having a hydrogen content of less than 20 atomic % when the entire amorphous carbon film is taken as 100 atomic % is suitable for the fuel cell separator of the present invention, because the amorphous carbon film has a low volume resistivity (not more than $10^{-1}$ Ω·cm) and a low contact resistance. Especially, a nitrogen-containing amorphous carbon film formed by plasma CVD in which a reaction gas containing a nitrogen-containing aromatic compound is used and electricity is discharged at a voltage of not less than 1000 V or not less than 2000 V has not only superior conductivity but also high hardness, high density and few defects. A fuel cell separator having such an amorphous carbon film is superior not only in conductivity but also in corrosion resistance.

It is noted that in the description of the present invention, density of an amorphous carbon film is evaluated by hardness of the amorphous carbon film. As hardness values of the amorphous carbon film, values measured by using a nanoindent tester (TriboScope produced by Hysitron Inc.) are employed. Since a hard amorphous carbon film is dense and has few defects, corrosion of a substrate surface covered with the amorphous carbon film is effectively suppressed. Hardness of an amorphous carbon film suitable for a fuel cell separator is not less than 3 GPa, not less than 5 GPa or not less than 10 GPa. It is practical to define the upper limit of hardness of the amorphous carbon film as not more than 30 GPa.

Moreover, film thickness of the amorphous carbon film is not particularly limited, but a thicker film exhibits higher corrosion resistance. Therefore, preferably the film thickness of the amorphous carbon film is not less than 1 nm or not less than 10 nm. However, since a hard dense amorphous carbon film is more likely to be peeled off or cracked with an increase in thickness, it is preferable that the film thickness is not more than 20 μm or not more than 10 μm.

The amorphous carbon film, the amorphous carbon film forming process, the conductive member provided with the amorphous carbon film and the fuel cell separator of the present invention have been described above by way of the embodiments, but the present invention is not limited to the above embodiments. For example, embodiments of the amorphous carbon film, a portion to be covered, the shape of the separator and so on in the fuel cell separator of the present invention can be appropriately employed.

Based on the above embodiments, conductive members were produced by forming various kinds of amorphous carbon films on surfaces of substrates. First, a device for forming a film by DC plasma CVD (abbreviated as "PCVD film-forming device") used in production of the conductive members and procedure for forming amorphous carbon films will be described, using FIG. 2.

[PCVD Film-Forming Device and Procedure for Forming Amorphous Carbon Films]

Figure 2:
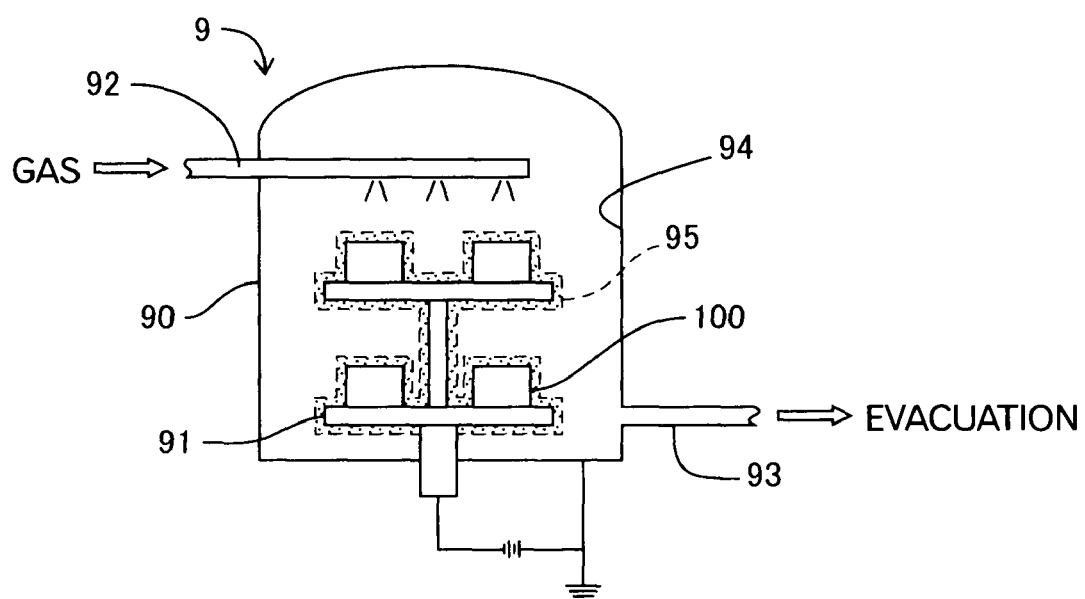
FIG. 2 is a schematic view of a DC plasma CVD film-forming device.

As shown in FIG. 2, a PCVD film-forming device 9 is provided with a chamber 90 formed of stainless steel, a bench 91, a gas inlet pipe 92, and a gas outlet pipe 93. The gas inlet pipe 92 is connected to various gas cylinders (not shown) by way of valves (not shown). The gas outlet pipe 93 is connected to a rotary pump (not shown) and a diffusion pump (not shown) by way of valves (not shown).

Substrates 100 are placed on the bench 91 installed in the chamber 90. After the substrates 100 are placed, the chamber 90 is tightly sealed and gases in the chamber 90 are evacuated by the rotary pump and the diffusion pump which are connected to the gas outlet pipe 93.

In forming amorphous carbon films on the substrates 100, first, hydrogen gas and argon are introduced from the gas inlet pipe 92 into the chamber 90. In the following embodiments, hydrogen gas was introduced at 30 sccm and argon gas was introduced at 30 sccm and gas pressure was set to about 450 Pa. Then, when DC voltage is applied between a stainless steel anode plate 94 and the bench 91, which are installed in the chamber 90, electric discharge starts. In the following embodiments, a 400 V DC voltage was applied and temperature of the substrates 100 was raised to a predetermined film-forming temperature by ion bombardment. Next, in addition to the hydrogen gas and the argon gas, any one of methane gas, benzene gas, toluene gas and pyridine gas and, if necessary, TMS gas or nitrogen gas is introduced as a reaction gas from the gas inlet pipe 92 at a predetermined flow rate. Then, when a predetermined electric power is applied between the stainless steel anode plate 94 and the bench 91, which are installed in the chamber 90, electric discharge 95 starts and amorphous carbon films are formed on surfaces of the substrates 100.

[Production of Conductive Members and Evaluation I]

In the following embodiments, conductive members having different amorphous carbon film compositions were produced by controlling flow rate of the reaction gas and film-forming temperature to the conditions set forth in Table 1. It is noted that other conditions for forming amorphous carbon films were pressure: 400 to 533 Pa, voltage: 300 to 500 V (electric current: 0.5 to 2 A). The film thickness was controlled by adjusting film-forming time.

TABLE 1

| | CONDUCTIVE MEMBER | REACTION GAS [sccm] | | | | | FILM-FORMING TEMPERATURE [° C.] |
|---|---|---|---|---|---|---|---|
| | | TMS | NITROGEN | METHANE | BENZENE | TOLUENE | |
| COMP. EX. 1 | #C1 | 1 | 0 | 50 | 0 | 0 | 300 |
| COMP. EX. 2 | #C2 | 0 | 0 | 0 | 20 | 0 | 400 |
| COMP. EX. 3 | #C3 | 0 | 0 | 0 | 0 | 20 | 400 |
| EX. 1 | #11 | 0 | 0 | 0 | 20 | 0 | 500 |
| EX. 2 | #12 | 0 | 0 | 0 | 20 | 0 | 580 |
| EX. 3 | #13 | 0 | 0 | 0 | 20 | 0 | 600 |
| EX. 4 | #14 | 0 | 50 | 0 | 20 | 0 | 500 |
| EX. 5 | #15 | 0 | 0 | 0 | 0 | 20 | 500 |
| EX. 6 | #16 | 0 | 0 | 0 | 0 | 20 | 600 |
| EX. 7 | #17 | 1 | 0 | 0 | 30 | 0 | 500 |
| REF. EX. 1 | #01 | 2 | 0 | 0 | 20 | 0 | 500 |

Conductive members #11 to #17, #01 and #C1 to #C3 were produced by forming amorphous carbon films having a film thickness of 3 μm on substrates (cold rolled steel plates: SPCC) by the abovementioned procedure. Measurement results of the film composition of the amorphous carbon films of the respective conductive members are shown in Table 2. The C, N and Si contents in the amorphous carbon films were quantitatively determined by electron probe microanalysis (EPMA), X-ray photoelectron spectroscopy (XPS), Auger electron spectroscopy (AES), and Rutherford backscattering spectroscopy (RBS). Moreover, the H content was quantitatively determined by elastic recoil detection analysis (ERDA). ERDA is a method for measuring a hydrogen concentration in a film by radiating a 2-MeV helium ion beam on a surface of the film and detecting hydrogen sputtered off from the film by a semiconductor detector. Moreover, the amounts of $Csp^2$ and $Csp^3$ were quantitatively determined from NMR spectra as mentioned in detail before.

TABLE 2

| | CONDUCTIVE MEMBER | FILM COMPOSITION [at %] | | | | RATIO IN CARBON [at %] | |
|---|---|---|---|---|---|---|---|
| | | Si | C | N | H | $Csp^2$ | $Csp^3$ |
| COMP. EX. 1 | #C1 | 11 | 51 | 0 | 38 | 64 | 36 |
| COMP. EX. 2 | #C2 | 0 | 63 | 0 | 37 | 85 | 15 |
| COMP. EX. 3 | #C3 | 0 | 62 | 0 | 38 | 84 | 16 |
| EX. 1 | #11 | 0 | 72 | 0 | 28 | 83 | 17 |
| EX. 2 | #12 | 0 | 74 | 0 | 26 | 84 | 16 |
| EX. 3 | #13 | 0 | 85 | 0 | 15 | 85 | 15 |
| EX. 4 | #14 | 0 | 70 | 2 | 28 | 83 | 17 |
| EX. 5 | #15 | 0 | 72 | 0 | 28 | 82 | 18 |
| EX. 6 | #16 | 0 | 80 | 0 | 20 | 83 | 17 |
| EX. 7 | #17 | 0.8 | 77.2 | 0 | 22 | 75 | 25 |
| REF. EX. 1 | #01 | 3 | 75 | 0 | 22 | 75 | 25 |

Figure 3:
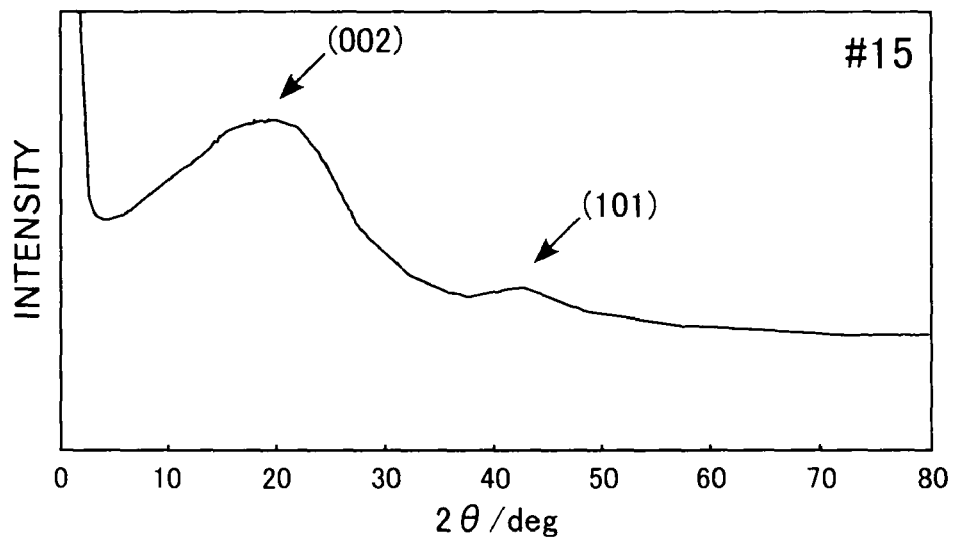
FIG. 3 shows an X-ray diffraction pattern of an amorphous carbon film which a conductive member #15 has.

Moreover, the amorphous carbon films which the conductive members #15, #16 and #C3 had were subjected to X-ray diffraction (XRD) analysis. The XRD analysis was conducted by collecting amorphous carbon films formed on the substrates in a powdery form to prepare powdery samples and analyzing the samples by an XRD apparatus. As an example of analyzed results, an X-ray diffraction pattern of the amorphous carbon film which the conductive member #15 has is shown in FIG. 3. Diffraction peaks corresponding to (002) planes and (101) planes of graphite appeared in the vicinity of the diffraction angle 2θ of 18° and 42°. From the fact that these peaks had broad halo patterns, it was confirmed that the amorphous carbon film which the conductive member #15 had was an amorphous carbon film having no long-range order or crystal structure. It was also confirmed from the appearance of halo patterns that the amorphous carbon films which the conductive members #16 and #C3 had were also amorphous carbon films having no crystal structure. Mean interplanar spacings of (002) planes calculated based on these XRD patterns by using Bragg's law are shown in Table 3.

TABLE 3

| | CONDUCTIVE MEMBER | MEAN INTERPLANAR SPACING of (002) PLANES [nm] |
|---|---|---|
| COMP. EX. 3 | #C3 | 0.51 |
| EX. 5 | #15 | 0.48 |
| EX. 6 | #16 | 0.41 |

[Measurement of Volume Resistivity]

Generally, electric resistance of a thin film formed on a surface of a substrate is measured by using two-terminal method, four-probe method, four-terminal method or the like. The two-terminal method measures a drop in voltage between two points, but cannot precisely measure volume resistivity of a thin film because the drop includes contact resistance between an electrode and the thin film. Therefore, it is recommended to use four-probe method (JIS K 7194, JIS R 1637) or four-terminal method (ISO 3915), which are not affected by contact resistance. Accordingly, four-probe method was employed for measuring resistance of the amorphous carbon films which the respective conductive members had.

Moreover, in the abovementioned conductive members, the substrates had a lower volume resistivity than those of the amorphous carbon films. Therefore, if resistance is measured as they are, an electric current flows also to the substrate side and volume resistivity of amorphous carbon films is measured lower than actual values. Consequently, in order to measure volume resistivity of the amorphous carbon films themselves, the following treatment (FIG. 4) was applied to the respective conductive members.

Figure 4:
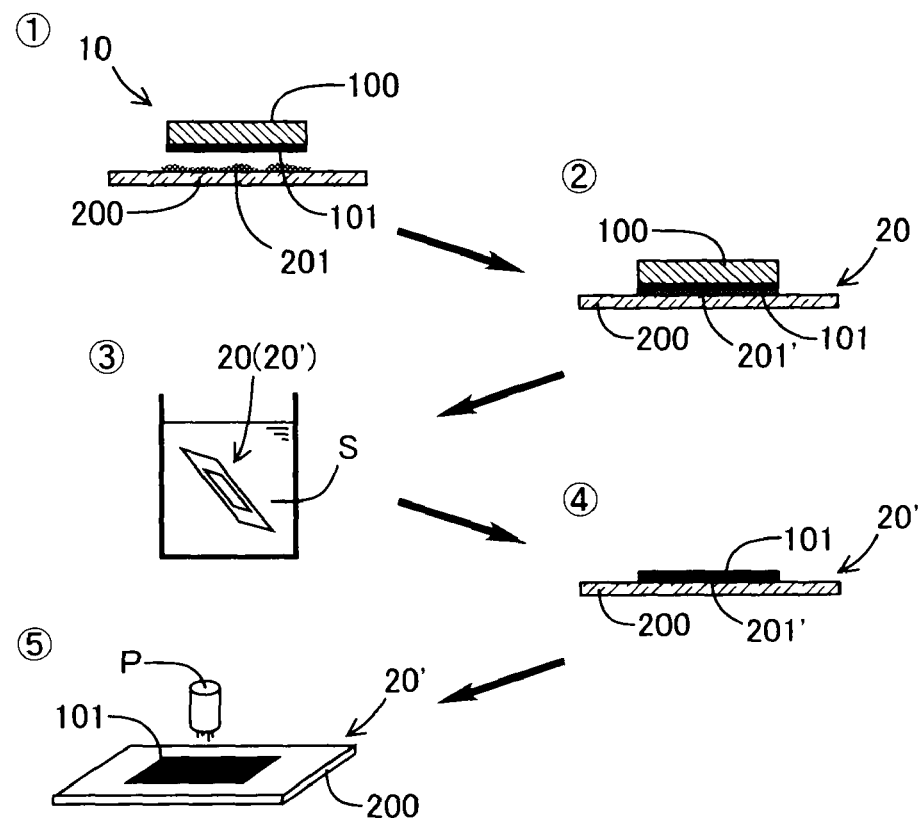
FIG. 4 is a schematic view for explaining procedure for producing a test piece to be used for volume resistivity measurement.

In FIG. 4, a conductive member 10 comprises a substrate 100, and an amorphous carbon film 101 formed on a surface of the substrate 100. First, a surface of a glass plate 200 and a surface of the amorphous carbon film 101 of the conductive member 100 were glued with an adhesive 201, thereby producing an assembly 20. After the adhesive 201 was dried sufficiently, the assembly 20 was immersed in an etching solution S to etch the substrate 100. Thus, a test specimen 20' in which the amorphous carbon film 101 was fixed on a surface of the glass plate 200 was obtained. Here, the glass plate 200 and an adhesive layer 201' comprising the used adhesive 201 had insulation properties, as indicated by volume resistivity of about $10^{14}$ $\Omega \cdot$cm. Therefore, if resistance measurement is carried out by using the test specimen 20', precise volume resistivity of the amorphous carbon film can be obtained. After the test specimen 20' was washed with pure water, a surface of the amorphous carbon film 101 was subjected to XPS analysis and it was confirmed that a substrate component such as iron did not remain on the surface and that no structural change occurred in carbon. Moreover, it was confirmed by scanning electron microscope that there were no cracks in the amorphous carbon film 101. Volume resistivity of the amorphous carbon film 101 was measured by four-probe method, using the obtained test specimen 20' and applying an electric current of 100 mA to 0.1 μA. Measurement results are shown in Table 4 together with surface resistivity.

It is noted that an α-cyanoacrylate adhesive was employed as the adhesive 201 and a ferric chloride solution was employed as the etching solution S. Moreover, a resistance measuring device provided with four probes P (Loresta GP produced by Mitsubishi Chemical Corporation) was used.

TABLE 4

| | CONDUCTIVE MEMBER | SURFACE RESISTIVITY [Ω/□] | VOLUME RESISTIVITY [Ω · cm] |
|---|---|---|---|
| COMP. EX. 1 | #C1 | $8.0 \times 10^{13}$ | $1.0 \times 10^{12}$ |
| COMP. EX. 2 | #C2 | $4.3 \times 10^{7}$ | $6.8 \times 10^{3}$ |
| COMP. EX. 3 | #C3 | $2.5 \times 10^{8}$ | $1.1 \times 10^{5}$ |
| EX. 1 | #11 | $1.0 \times 10^{5}$ | $2.7 \times 10^{1}$ |
| EX. 2 | #12 | $3.3 \times 10^{3}$ | $8.6 \times 10^{-1}$ |
| EX. 3 | #13 | $3.9 \times 10^{2}$ | $6.2 \times 10^{-2}$ |
| EX. 4 | #14 | $8.3 \times 10^{4}$ | $1.0 \times 10^{1}$ |
| EX. 5 | #15 | $1.4 \times 10^{5}$ | $4.4 \times 10^{1}$ |
| EX. 6 | #16 | $8.8 \times 10^{3}$ | $3.5 \times 10^{-1}$ |
| EX. 7 | #17 | $1.6 \times 10^{3}$ | $3.2 \times 10^{1}$ |
| REF. EX. 1 | #01 | $2.0 \times 10^{3}$ | $4.0 \times 10^{1}$ |

It is noted that since the amorphous carbon film of the conductive member #C1 has high resistance, the resistivity of #C1 in Table 4 is a value obtained by measuring the amorphous carbon film as it was formed on the substrate by constant voltage application method (JIS K 6911).

In #11 to #17 and #01 in which amorphous carbon films were formed at high film-forming temperatures of 500 to 600° C., the H content of the amorphous carbon films was reduced to not more than 30 atomic %. The effect of reducing the H content was more remarkable with an increase in the film-forming temperature. For example, in a group comprising #11 to #13 and #C2 and a group comprising #15, #16 and #C3, film-forming temperature of the amorphous carbon film forming conditions was different, but the H content of the amorphous carbon films was greatly reduced with an increase in the film-forming temperature.

Moreover, in #C1 having an amorphous carbon film formed by using a reaction gas containing methane ($CH_4$), the amount of $Csp^2$ was as small as 64 atomic %. On the other hand, in all the conductive members except #C1 having amorphous carbon films formed by using a reaction gas containing benzene or toluene, which was a carbocyclic compound, $Csp^2$ was present in an amount of not less than 75 atomic %.

11 to #17 and #01 exhibited superior conductivity, because C—H bonds (σ bonds) were decreased and molecular termination was suppressed by controlling the H content to not more than 30 atomic % and delocalization of π electrons was promoted by having $Csp^2$ in the films in an amount of not less than 70 atomic %. Above all, #13 having a low H content (15 atomic %) and a large amount of $Csp^2$ (85 atomic %) attained a very small resistivity (volume resistivity: $6.2 \times 10^{-2}$ $\Omega \cdot$cm) owing to a great increase in π electrons.

On the other hand, in #C1 to #C3 in which the H content exceeded 30 atomic %, because a lot of H atoms formed C—H bonds (σ bonds) with C atoms and σ electrons were localized, volume resistivity exceeded $10^3$ $\Omega \cdot$cm. Especially, in #C1 having a high Si content, since Si atoms having an $sp^3$ hybrid orbital formed σ bonds with H atoms and σ electrons were localized, resistivity was even higher.

14 containing N in the amorphous carbon film exhibited a lower resistivity than that of #11 having an amorphous carbon film formed in similar conditions except a difference in the existence of nitrogen gas, because N atoms served as n-type donors.

Moreover, #17 and #01 contained Si, but because the Si content was suppressed to not more than 5 atomic %, the Si content did not greatly affect conductivity. #17 having a Si content of less than 1 atomic % had superior conductivity to that of #01 having a Si content of 3 atomic %.

Each of #15 and #16 having a volume resistivity of not more than $10^2$ $\Omega \cdot$cm had a mean interplanar spacing of (002) planes of not more than 0.5 nm. On the other hand, #C3 exhibiting a high volume resistivity had a mean interplanar spacing of (002) planes exceeding 0.5 nm. This is because interaction of π electrons between the planes was enhanced by the small interplanar spacing.

[Production of Conductive Members and Evaluation II]

Next, conductive members having different amorphous carbon film compositions were produced, controlling reaction gas flow rate, film-forming voltage and film-forming temperature to the conditions set forth in Table 5. It is noted that the film-forming pressure was 1 to 1000 Pa, the voltage in forming films was 200 to 2500 V, and the electric current was 0.1 to 10 A. Moreover, film-forming time was controlled in accordance with film thickness.

TABLE 5

| | CONDUCTIVE MEMBER | REACTION GAS [sccm] | | | | VOLTAGE [V] | FILM-FORMING TEMPERATURE [° C.] |
|---|---|---|---|---|---|---|---|
| | | TMS | PYRIDINE | METHANE | BENZENE | | |
| COMP. EX. 1 | #C1 | 1 | 0 | 50 | 0 | 200 | 300 |
| COMP. EX. 2 | #C2 | 0 | 0 | 0 | 20 | 250 | 400 |

TABLE 5-continued

| | CONDUCTIVE MEMBER | REACTION GAS [sccm] | | | | VOLTAGE [V] | FILM-FORMING TEMPERATURE [° C.] |
|---|---|---|---|---|---|---|---|
| | | TMS | PYRIDINE | METHANE | BENZENE | | |
| EX. 8 | #21 | 0 | 0 | 0 | 20 | 300 | 500 |
| EX. 9 | #22 | 0 | 7 | 0 | 0 | 2000 | 400 |
| EX. 10 | #23 | 0 | 0 | 0 | 20 | 380 | 600 |
| EX. 11 | #24 | 0 | 0 | 0 | 10 | 380 | 600 |
| EX. 12 | #25 | 0 | 0 | 0 | 10 | 380 | 650 |
| EX. 13 | #26 | 0 | 7 | 0 | 0 | 2500 | 400 |
| EX. 14 | #27 | 0 | 15 | 0 | 0 | 2500 | 400 |
| EX. 15 | #28 | 1 | 0 | 0 | 10 | 380 | 600 |
| EX. 16 | #29 | 1 | 7 | 0 | 0 | 380 | 600 |
| EX. 17 | #30 | 0.5 | 15 | 0 | 20 | 2500 | 400 |
| REF. EX. 2 | #02 | 3 | 0 | 0 | 10 | 370 | 600 |

Conductive members #21, #22, #24 to #30 and #02 were produced by forming amorphous carbon films having a film thickness of 3 μm on substrates (cold rolled steel plate: SPCC) by similar procedure to that described in [Production of Conductive Members I]. It is noted that #23 was a similar specimen to #13 mentioned above. Measurement results of the film composition of amorphous carbon films of the respective conductive members are shown in Table 6. The C, N and Si contents in the amorphous carbon films were quantitatively determined by EPMA, XPS, AES and RBS. Moreover, the H content was quantitatively determined by ERDA. Moreover, the amounts of $Csp^2$ and $Csp^3$ were quantitatively determined from NMR spectra as mentioned in detail before.

MPa was applied to the two copper plates 32 in a vertical direction to the contact surface by a load cell. With this state, a 1 A direct current was applied between the two copper plates 32 from a low DC power source. A potential difference between the conductive member 10 and the carbon paper 31 was measured after 60 seconds from the start of the load application and an electric resistance value was calculated. A contact resistance value was thus obtained.

Measurement results of volume resistance and contact resistance of the amorphous carbon films of the respective conductive members are shown in Table 7.

TABLE 6

| | CONDUCTIVE MEMBER | FILM COMPOSITION [at %] | | | | RATIO IN CARBON [at %] | |
|---|---|---|---|---|---|---|---|
| | | Si | C | N | H | $Csp^2$ | $Csp^3$ |
| COMP. EX. 1 | #C1 | 11 | 51 | 0 | 38 | 64 | 36 |
| COMP. EX. 2 | #C2 | 0 | 63 | 0 | 37 | 85 | 15 |
| EX. 8 | #21 | 0 | 75 | 0 | 25 | 82 | 18 |
| EX. 9 | #22 | 0 | 76 | 2 | 22 | 95 | 5 |
| EX. 10 | #23 | 0 | 85 | 0 | 15 | 85 | 15 |
| EX. 11 | #24 | 0 | 81 | 0 | 19 | 95 | 5 |
| EX. 12 | #25 | 0 | 83 | 0 | 17 | 90 | 10 |
| EX. 13 | #26 | 0 | 79 | 5 | 16 | 99 | 1 |
| EX. 14 | #27 | 0 | 80 | 6 | 14 | 99 | 1 |
| EX. 15 | #28 | 0.9 | 81.1 | 0 | 18 | 90 | 10 |
| EX. 16 | #29 | 0.8 | 76.2 | 5 | 18 | 95 | 5 |
| EX. 17 | #30 | 0.9 | 81 | 5.1 | 13 | 98 | 2 |
| REF. EX. 2 | #02 | 3 | 77 | 0 | 20 | 86 | 14 |

Test specimens were produced from the respective conductive members by similar procedure to the above and volume resistivity of amorphous carbon films which the conductive members #21 to #30, #02 and #C1, #C2 had was measured. Contact resistance between the respective conductive members and carbon paper, which will constitute a gas diffusion layer in a fuel cell separator, was also measured.

Figure 5:
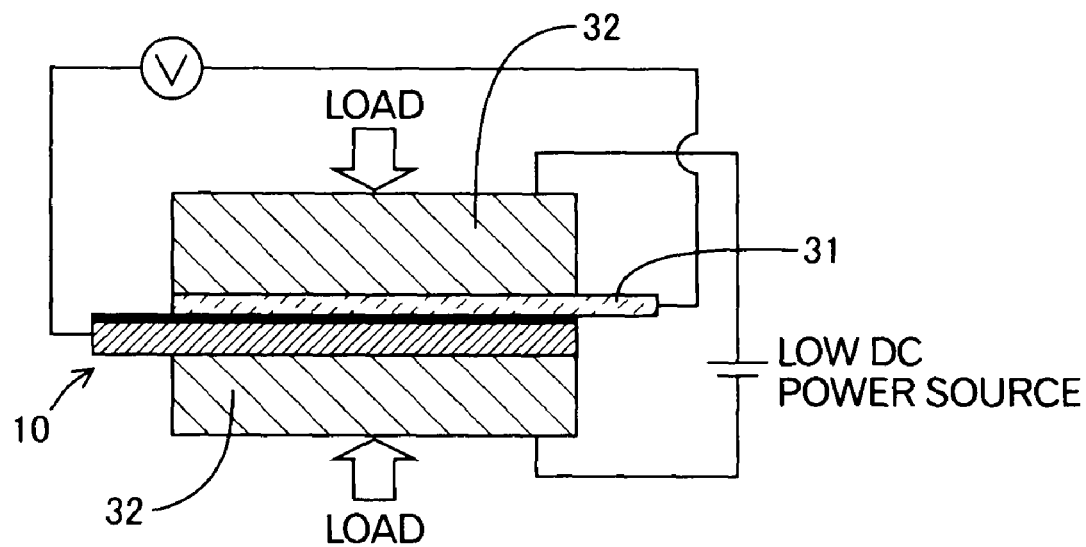
FIG. 5 is a cross-sectional view schematically showing a device structure for measuring contact resistance between a conductive member and carbon paper.

As shown in FIG. 5, contact resistance was measured by placing carbon paper 31 on an amorphous carbon film of a conductive member 10 and sandwiching them with two copper plates 32. Contact surfaces of the copper plates 32 which contacted the conductive member 10 and the carbon paper 31 were plated with gold. At this time, a contact surface of the amorphous carbon film of the conductive member 10 and the carbon paper 31 had an area of 2 cm×2 cm. A load of 1.47

TABLE 7

| | CONDUCTIVE MEMBER | VOLUME RESISTIVITY [Ω·cm] | CONTACT RESISTANCE [mΩcm$^2$] |
|---|---|---|---|
| COMP. EX. 1 | #C1 | $1.0 \times 10^{12}$ | >100000 |
| COMP. EX. 2 | #C2 | $6.8 \times 10^3$ | 10000 |
| EX. 8 | #21 | $7.3 \times 10^{-1}$ | 1080 |
| EX. 9 | #22 | 1.8 | 1508 |
| EX. 10 | #23 | $6.2 \times 10^{-2}$ | 4 |
| EX. 11 | #24 | $9.2 \times 10^{-2}$ | 5 |
| EX. 12 | #25 | $4.5 \times 10^{-2}$ | 4 |
| EX. 13 | #26 | $4.8 \times 10^{-2}$ | 7 |
| EX. 14 | #27 | $1.8 \times 10^{-2}$ | 3 |
| EX. 15 | #28 | $9.8 \times 10^{-2}$ | 9 |
| EX. 16 | #29 | $7.3 \times 10^{-2}$ | 10 |
| EX. 17 | #30 | $3.8 \times 10^{-2}$ | 6 |
| REF. EX. 2 | #02 | 1.1 | 298 |

21 to #30 and #02 were conductive members having amorphous carbon films formed at high film-forming temperatures of 500 to 650° C., or conductive members having amorphous carbon films formed at voltages of not less than 2000 V. In these conductive members, the H content of the amorphous carbon films was reduced to not more than 30 atomic %. Also in the respective conductive members #21 to #30 and #02, as the amorphous carbon film was formed at a higher temperature, the H content tended to be smaller. It is noted that #23 having an amorphous carbon film formed at 600° C. had a lower H content than that of #25 having an amorphous carbon film formed at 650° C. This is believed to be because different direct current power supply units were used for forming films. Moreover, even when the film-forming temperature was 400° C. as in #22, #26, #27 and #30, the H content was reduced by forming the amorphous carbon films at high voltages of not less than 2000 V.

Moreover, in #C1 in which an amorphous carbon film was formed by using a reaction gas containing methane ($CH_4$), the amount of $Csp^2$ was as small as 64 atomic %. On the other hand, in all the conductive members except #C1 in which amorphous carbon films were formed by using a reaction gas containing benzene or pyridine, $Csp^2$ was present in an amount of not less than 80 atomic %.

23 to #30 having amorphous carbon films with an H content of less than 20 atomic % had superior conductivity as indicated by low volume resistance values and low contact resistance values. Especially, #23, #25 to #27 and #30 having amorphous carbon films with an H content of less than 18 atomic % exhibited even lower volume resistance values and lower contact resistance values.

22, #26, #27, #29 and #30 having amorphous carbon films formed by using a pyridine-containing reaction gas had $Csp^2$ in an amount of not less than 95% and had superior volume resistivity to that of #14 (Table 1) having an amorphous carbon film formed by using a reaction gas containing benzene and nitrogen. Owing to the use of the pyridine-containing reaction gas, amorphous carbon films containing a large amount of $Csp^2$ were formed. Moreover, #26, #27 and #30 exhibited excellent conductivity. If the H content is less than 20 atomic % or less than 18 atomic % and the N content is not less than 4 atomic % and not more than 7 atomic %, it is estimated that a conductive member has an electric conductivity as high as those of #26, #27 and #30.

28 to #30 and #02 contained Si, but since the Si content of the amorphous carbon films was suppressed to not more than 5 atomic %, the Si content did not greatly affect conductivity. #28 having an Si content of less than 1 atomic % had superior conductivity to that of #02 having an Si content of 3 atomic %. If the H content is less than 20 atomic % or less than 18 atomic % and the Si content is not less than 0.7 atomic % and less than 1 atomic %, it can be estimated that a conductive member has an electric conductivity as high as those of #28 to #30.

[Production of Conductive members and Evaluation III]

The following test specimens were produced: a test specimen A0 comprising pure titanium, which is generally used for a separator, a test specimen B0 comprising stainless steel (JIS SUS316L), and a test specimen C0 comprising graphite (a fuel cell separator material produced by Tokai Carbon Co., Ltd.) and test specimens A1 to A6 in which amorphous carbon films having the same film composition as that of any of the conductive members #21 and #25 to #27 were formed on pure titanium. The kind of substrates of the respective test specimens and, for the test specimens A1 to A6, the kind and film thickness of the amorphous carbon films formed on the substrates are shown in Table 8. These test specimens were subjected to hardness measurement and corrosion test, and evaluated on characteristics as a fuel cell separator.

Hardness was measured by using the abovementioned nanoindenter tester. By using the nanoindenter tester, hardness of an amorphous carbon film itself can be measured without being affected by hardness of a substrate. Measurement results are shown in Table 8.

Figure 6:
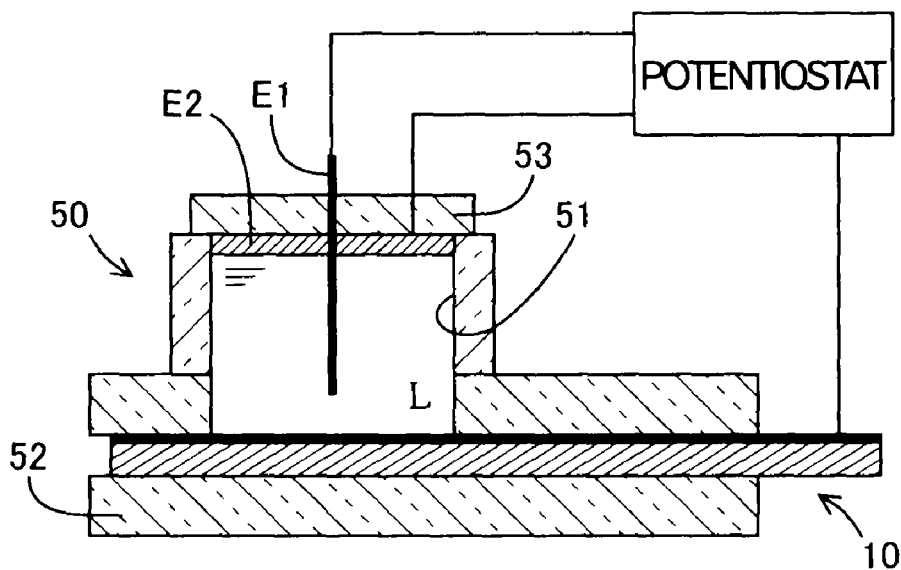
FIG. 6 is a cross-sectional view schematically showing a measurement device to be used in a corrosion test.

As shown in FIG. 6, the corrosion test was conducted by using a measurement cell 50 having an accommodation space 51 of 34 mm in inner diameter and 30 mm in height. The accommodation space 51 has axial ends which are both open and a fixing plate 52 at a lower end for fixing a test specimen 10 (a conductive member 10) to the measurement cell 50. Moreover, at an upper end of the accommodation space 51, there is provided a lid body 53 to which a reference electrode E1 and a counter electrode E2 are fixed. The rod-like reference electrode E1 is fixed so as to penetrate the lid body 53 having an inner surface on which the counter electrode E2 was attached.

In order to measure corrosion current, the accommodation space 51 of the measurement cell 50 in which the test specimen 10 was fixed was filled with an electrolyte L. The electrolyte L was prepared by adding $Cl^-$ and $F^-$ to a dilute sulfuric acid of pH 2 to 4 in accordance with test conditions. Next, a reference electrode E1 and a counter electrode E2 both comprising platinum (Pt) were prepared and fixed to the lid body 53 and then the upper end of the accommodation space 51 was covered with the lid. At this time, the reference electrode E1 and the counter electrode E2 were immersed in the electrolyte L. Then corrosion current between E2 and the test specimen 10 was measured by holding temperature of the electrolyte at 80° C. and applying a voltage of 0.26 V (with respect to Pt; 1 V with respect to a hydrogen standard electrode) between E1 and the test specimen 10. Corrosion test conditions (pH, $Cl^-$ concentration, and $F^-$ concentration of the electrolyte L and test time) and average corrosion current values are shown in Table 8.

Contact resistance values after the abovementioned corrosion test were measured. Measurement method was similar to the method mentioned before. Measurement results are shown in Table 8 together with contact resistance values before the corrosion test. Moreover, metallic ion concentration of the electrolyte L after the corrosion test was measured by inductively coupled high frequency plasma spectrometry (ICP). The obtained amount of titanium elution is shown in Table 8. Moreover, mass of the test specimens before and after the corrosion test was measured by using a scale which can measure a minimum of 0.01 mg. Changes in mass between before and after the corrosion test are shown in Table 8.

TABLE 8-1

| TEST SPECIMEN | KIND OF SUBSTRATE AND FILM | FILM THICKNESS [μm] | FILM HARDNESS [GPa] |
|---|---|---|---|
| A0 | pure Ti | — | — |
| B0 | SUS316L | — | — |
| C0 | GRAPHITE | — | — |
| A1 | PURE Ti + FILM of #21 | 4.5 | 2.5 |
| A2 | PURE Ti + FILM of #25 | 0.3 | 3.9 |
| A3 | PURE Ti + FILM of #26 | 1.8 | 12.8 |
| A4 | PURE Ti + FILM of #27 | 1.7 | 13.3 |
| A5 | PURE Ti + FILM of #27 | 0.1 | 13.3 |
| A6 | PURE Ti + FILM of #30 | 0.6 | 11.7 |

TABLE 8-2

| TEST SPECIMEN | CORROSION TEST CONDITIONS | | | | CORROTION RESISTANCE [mΩcm²] | | AVERAGE CORROSION CURRENT [μA/cm²] | AMOUNT OF Ti ELUTION [ppm] | CHANGE in MASS [mg] |
|---|---|---|---|---|---|---|---|---|---|
| | pH | Cl⁻ [ppm] | F⁻ [ppm] | TEST TIME [h] | BEFORE TEST | AFTER TEST | | | |
| A0 | 4 | 10 | 5 | 48 | 172 | 361 | 0.3 | 0.02 | 0.0 |
| B0 | 4 | 10 | 5 | 48 | 25 | 107 | 0.1 | — | — |
| C0 | 4 | 10 | 5 | 48 | 3 | 3 | 0.7 | — | 0.0 |
| A1 | 4 | 10 | 5 | 48 | 1080 | 1180 | 2.2 | 0.01 | 0.0 |
| A2 | 4 | 10 | 5 | 48 | 4 | 5 | 0.7 | <0.006 | 0.0 |
| | 4 | 10 | 5 | 96 | 4 | 7 | 0.7 | <0.006 | 0.0 |
| A3 | 4 | 10 | 5 | 48 | 7 | 9 | 0.2 | <0.006 | 0.0 |
| | 4 | 10 | 5 | 192 | 7 | 10 | 0.2 | <0.006 | 0.0 |
| A4 | 4 | 10 | 5 | 48 | 3 | 4 | 0.2 | <0.006 | 0.0 |
| | 2 | 10 | 50 | 48 | 3 | 4 | 0.4 | <0.006 | 0.0 |
| A5 | 4 | 10 | 5 | 75 | 4 | 7 | 0.2 | <0.006 | 0.0 |
| A6 | 4 | 10 | 5 | 75 | 6 | 8 | 0.1 | <0.006 | 0.0 |

Pure titanium (the test specimen A0) and SUS316L (the test specimen B0) which are highly corrosion resistant among metallic materials had small average corrosion current values but high contact resistance values after the corrosion test, because high corrosion currents flew in an initial stage of the corrosion test and then these materials were passivated. On the other hand, graphite (the test specimen C0), which is a commercially available separator material, had a higher average corrosion current value than those of the test specimens A0 and B0, but small contact resistance values before and after the corrosion test and there was no change between these values.

The test specimens A1 to A6, in which amorphous carbon covered pure titanium substrates, had no change in mass between before and after the corrosion test. The test specimen C0 and the test specimens A1 to A6 comprised the same carbon material, but it is believed that because of being amorphous, the test specimens A1 to A6 were insusceptible to intergranular corrosion. Moreover, since the test specimens A1 to A6 had three-dimensional C—C bonds of Csp³, which is not observed in graphite, and the test specimens A3 to A6 had stronger C—N bonds, the amorphous carbon films in themselves were highly insusceptible to corrosion.

The test specimen A1 was a test specimen having a conductive amorphous carbon film, but since the film hardness was less than 3 GPa, it is believed that the film was not sufficiently dense and the electrolyte easily reached a surface of a substrate. As a result, corrosion of the substrate occurred and an insulating layer was formed and conductive paths decreased, so contact resistance values after the corrosion test increased. Moreover, the amount of titanium elution into the electrolyte was also large. Therefore, the test specimen A1 was insufficient in terms of characteristics as a fuel cell separator.

The test specimens A2 to A6 had small contact resistance values before and after the corrosion test and the change between these values was small. The test specimens A2 to A6 were hardly passed through by corrosion current as indicated by an average corrosion current of not more than 0.7 μA/cm². Moreover, the amount of titanium elution was below a detection limit value and there was no change in mass between before and after the corrosion test. Namely, the test specimens A2 to A6 exhibited sufficient characteristics as fuel cell separators. Moreover, it was apparent from the evaluation results of the test specimens A1 to A6 that among the amorphous carbon films of the present invention, amorphous carbon films having a volume resistivity of not more than $10^{-1}$ Ω·cm are suitable for fuel cell separators.

The test specimens A3 and A4 were test specimens having excellent conductive amorphous carbon films and exhibited excellent corrosion resistance even under severe corrosion conditions in terms of the kind of electrolyte and test time. The test specimens A3 and A4 were more hardly passed through by an average corrosion current than graphite (the test specimen C0), and the amorphous carbon films in themselves were also highly insusceptible to corrosion. Moreover, the test specimens A3 and A4 had amorphous carbon films which were very hard and dense and had few defects. Therefore, corrosion of the substrates hardly occurred. It is estimated from the hardness measurement results of the amorphous carbon films which the test specimens A3 and A4 had that an amorphous carbon film having a hardness of not less than 10 GPa and not more than 18 GPa is suitable for a separator.

The test specimen A5 had a very small film thickness of 0.1 μm but was hardly passed through by corrosion current, as indicated by an average corrosion current of 0.2 μA/cm². Thus the test specimen A5 exhibited corrosion resistance as high as those of the test specimens A3 and A4. The test specimen A6 had the smallest average corrosion current value among all the test specimens in Table 8 and had small contact resistance values before and after the corrosion test and the change between these values was small. Thus the test specimen A6 was superior in corrosion resistance. This is estimated to be because density of the amorphous carbon film around the boundaries between the amorphous carbon film and the substrate was improved and ion elution from the substrate was suppressed.

Moreover, the substrates obtained by removing the amorphous carbon films from the test specimens A1 to A6 were subjected to XRD analysis, and as a result, similar peaks were detected before and after the corrosion test. Therefore, there was little change in the amount of $TiO_2$ in the pure titanium substrates between before and after the test.

Furthermore, the amorphous carbon films which the conductive members #24, #26, #27 and #30 in Table 5 to Table 7 had were collected in a powdery form and subjected to XRD analysis. According to the XRD analysis, halo patterns appeared in all the test specimens and it was confirmed that all the test specimens were amorphous carbon films. Mean interplanar spacings of (002) planes calculated based on these XRD patterns using Bragg's law are shown in Table 9.

TABLE 9

| | CONDUCTIVE MEMBER | MEAN INTERPLANAR SPACING of (002) PLANES [nm] |
|---|---|---|
| EX. 11 | #24 | 0.354 |
| EX. 13 | #26 | 0.355 |
| EX. 14 | #27 | 0.360 |
| EX. 17 | #30 | 0.357 |

Each of the conductive members #24, #26, #27 and #30 had high conductivity as indicated by a volume resistivity on the order of $10^{-2}$ Ω·cm. The mean interplanar spacing of (002) planes of each of these amorphous carbon films was close to a mean interplanar spacing (0.34 nm) of (002) planes of graphite.

[Production of Sliding Members and Evaluation]

A test specimen B0' having a disk shape of 30 mm in diameter, 3 mm in thickness and not more than 0.1 μm in surface roughness Rzjis and comprising stainless steel (JIS SUS440C), test specimens B1 and B2 which were formed amorphous carbon films having the same composition as that of the conductive member #27 or #30 on the test specimen B0', were prepared. The kind of the substrates of the respective test specimens and, as for the test specimens B1 and B2, the kind and film thickness of the amorphous carbon films formed on the substrates are shown in Table 10. These test specimens were subjected to a ball-on-disk test in the air under no lubrication, and measured on friction coefficient, wear width and wear depth so as to evaluate wear characteristics as sliding members.

Figure 7:
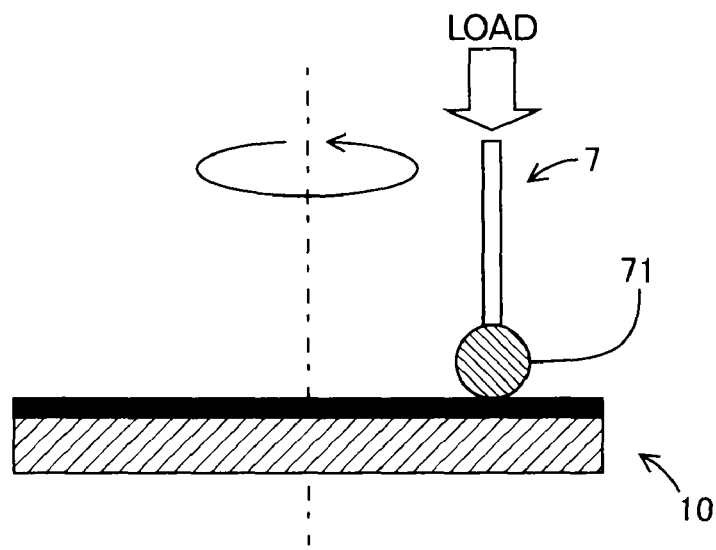
FIG. 7 is a schematic view of a ball-on-disk tester.
Figure 8:
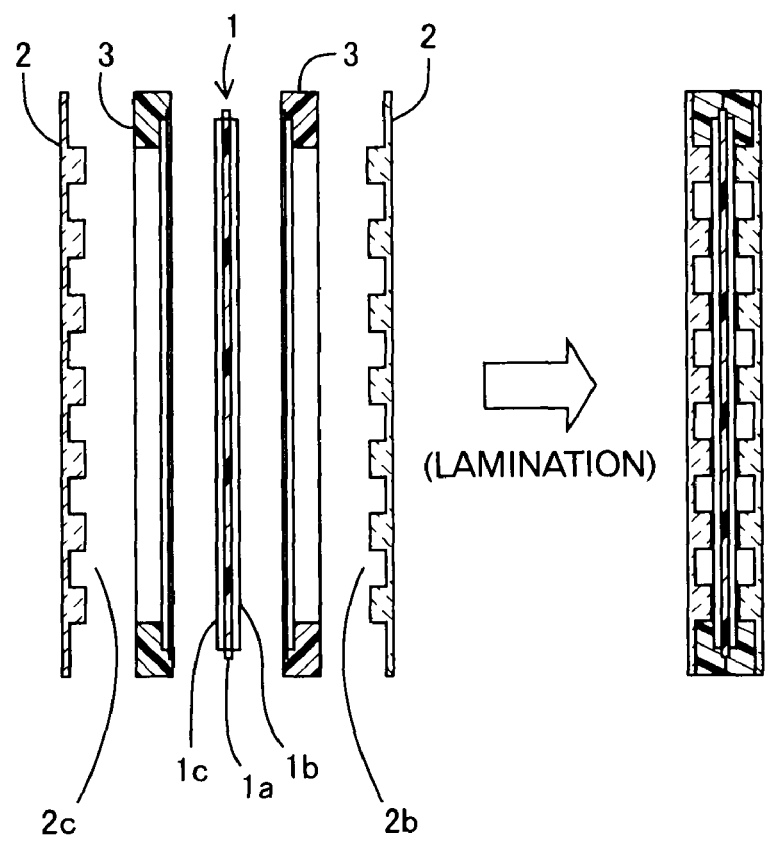
FIG. 8 is a cross-sectional view schematically showing an example of a single-cell solid polymer fuel cell.

FIG. 7 shows a schematic diagram of a ball-on-disk tester. As shown in FIG. 7, the ball-on-disk tester is constituted by a test specimen 10, which is a disk test specimen, and a mating member 7 having a ball 71 on a fore end thereof. The test specimen 10 and the ball 71 are placed in such a manner that an amorphous carbon film formed on the test specimen 10 and the ball 71 are in contact with each other. The ball 71 is a ball having a diameter of 6.35 mm and formed of bearing steel SUJ2 (Hv 750 to 800, surface roughness Rzjis not more than 0.1 mm).

First, after the test specimen 10 was revolved under no load, a load of 10 N was applied on the ball 71. Then the test specimen 10 and the ball 71 were slided against each other at a sliding speed of 0.2 m/s for 60 minutes and then friction coefficient, wear width and wear depth were measured. It is noted that actual surface pressure in sliding was about 1.3 GPa. Table 10 shows measurement results of friction coefficient, wear width and wear depth of the test specimens B0', B1 and B2.

TABLE 10

| TEST SPECIMEN | KIND OF SUBSTRATE AND FILM | FILM THICKNESS [μm] | FRICTION COEFFICIENT | WEAR WIDTH [μm] | WEAR DEPTH [μm] |
|---|---|---|---|---|---|
| B0' | SUS440C | — | 0.55 | 640 | * |
| B1 | SUS440C + FILM #27 | 1.8 | 0.30 | 480 | 0.20 |
| B2 | SUS440C + FILM #30 | 1.8 | 0.25 | 550 | 0.05 |

*: Unmeasurable because of adhesion of the mating material.

It was apparent from the results of B1 and B2 that by forming the amorphous carbon films of #27 and #30, friction coefficient was lowered and wear resistance was improved. This is believed to be because shear stress of the amorphous carbon films was increased by strong C=C bonds (147 kcal/mol) of Csp$^2$. Owing to their high conductivity, these amorphous carbon films are promising for contact point materials which require wear resistance.

The invention claimed is:

1. An amorphous carbon film, comprising carbon and hydrogen, wherein the amorphous carbon film comprises not more than 30 atomic % (excluding 0 atomic %) of hydrogen and, when the entire amount of the carbon is taken as 100 atomic %, carbon having an sp$^2$ hybrid orbital is present in an amount of not less than 70 atomic % and less than 100 atomic %.

2. The amorphous carbon film of claim 1, further comprising not more than 20 atomic % (excluding 0 atomic %) of nitrogen.

3. The amorphous carbon film of claim 2, further comprising not more than 5 atomic % (excluding 0 atomic %) of silicon.

4. The amorphous carbon film of claim 3, wherein the silicon content is less than 1 atomic %.

5. A conductive member provided with an amorphous carbon film, comprising a substrate, and the amorphous carbon film of claim 2 formed on at least part of the substrate.

6. The amorphous carbon film of claim 1, wherein the hydrogen content is less than 20 atomic %.

7. The amorphous carbon film of claim 1, further comprising not more than 3 atomic % of oxygen.

8. The amorphous carbon film of claim 1, having a mean interplanar spacing of (002) planes of from 0.34 to 0.50 nm inclusive.

9. The amorphous carbon film of claim 1, having a volume resistivity of not more than $10^2$ Ω·cm.

10. The amorphous carbon film of claim 9, having a volume resistivity of not more than $10^{-1}$ Ω·cm.

11. A conductive member provided with an amorphous carbon film, comprising a substrate, and the amorphous carbon film of claim 1 formed on at least part of the substrate.

12. A fuel cell separator, comprising a metallic substrate and an amorphous carbon film covering at least a surface of the substrate facing an electrode,
wherein the amorphous carbon film is the amorphous carbon film of claim 1.

13. The fuel cell separator of claim 12, wherein the amorphous carbon film has a hydrogen content of less than 20 atomic % when the entire amorphous carbon film is taken as 100 atomic %.

14. The fuel cell separator of claim 12, wherein the amorphous carbon film has a silicon content of less than 1 atomic % when the entire amorphous carbon film is taken as 100 atomic %.

15. The fuel cell separator of claim 12, wherein the amorphous carbon film has a volume resistivity of not more than $10^{-1}$ Ω·cm.

16. The fuel cell separator of claim 12, wherein the amorphous carbon film further comprises nitrogen, and a content of nitrogen is not more than 20 atomic % (excluding 0 atomic %) when the entire amorphous carbon film is taken as 100 atomic %.

17. An amorphous carbon film, comprising carbon, hydrogen and silicon, wherein the amorphous carbon film comprises not more than 30 atomic % (excluding 0 atomic %) of hydrogen and less than 1 atomic % (excluding 0 atomic %) of silicon and, when the entire amount of the carbon is taken as 100 atomic %, carbon having an $sp^2$ hybrid orbital is present in an amount of not less than 70 atomic % and less than 100 atomic %.

18. The amorphous carbon film of claim 17, wherein the hydrogen content is less than 20 atomic %.

19. The amorphous carbon film of claim 17, further comprises not more than 3 atomic % of oxygen.

20. The amorphous carbon film of claim 17, having a mean interplanar spacing of (002) planes of from 0.34 to 0.50 nm inclusive.

21. The amorphous carbon film of claim 17, having a volume resistivity of not more than $10^2$ $\Omega \cdot cm$.

22. The amorphous carbon film of claim 21, having a volume resistivity of not more than $10^{-1}$ $\Omega \cdot cm$.

23. A conductive member provided with an amorphous carbon film, comprising a substrate, and the amorphous carbon film of claim 17 formed on at least part of the substrate.

24. A fuel cell separator, comprising a metallic substrate and an amorphous carbon film covering at least a surface of the substrate facing an electrode,
wherein the amorphous carbon film is the amorphous carbon film set forth in claim 17.

25. The fuel cell separator of claim 24, wherein the amorphous carbon film has a hydrogen content of less than 20 atomic % when the entire amorphous carbon film is taken as 100 atomic %.

26. The fuel cell separator of claim 24, wherein the amorphous carbon film has a silicon content of less than 1 atomic % when the entire amorphous carbon film is taken as 100 atomic %.

27. The fuel cell separator of claim 24, wherein the amorphous carbon film has a volume resistivity of not more than $10^{-1}$ $\Omega \cdot cm$.

28. An amorphous carbon film forming process for forming the amorphous carbon film of claim 1 on a surface of a substrate by plasma CVD, comprising:
placing the substrate in a reaction vessel; introducing, into the reaction vessel, a reaction gas comprising one or more gases selected from the group consisting of a carbocyclic compound gas containing carbon having an $sp^2$ hybrid orbital, and a heterocyclic compound gas containing carbon having an $sp^2$ hybrid orbital and silicon and/or nitrogen; and discharging electricity.

29. The amorphous carbon film forming process of claim 28, wherein a carbocyclic compound of the carbocyclic compound gas is an aromatic hydrocarbon compound.

30. The amorphous carbon film forming process of claim 29, wherein the aromatic hydrocarbon compound is one or more selected from the group consisting of benzene, toluene, xylene and naphthalene.

31. The amorphous carbon film forming process of claim 28, wherein a heterocyclic compound of the heterocyclic compound gas is a nitrogen-containing heterocyclic compound containing nitrogen.

32. The amorphous carbon film forming process of claim 31, wherein the nitrogen-containing heterocyclic compound is one or more selected from the group consisting of pyridine, pyrazine, and pyrrole.

33. The amorphous carbon film forming process of claim 28, wherein the substrate has a temperature of not less than 500° C.

34. The amorphous carbon film forming process of claim 33, wherein the substrate has a temperature of not less than 600° C.

35. The amorphous carbon film forming process of claim 28, wherein the electricity is discharged at not less than 1000 V.

36. The amorphous carbon film forming process of claim 35, wherein the electricity is discharged at not less than 2000 V.

37. The amorphous carbon film forming process of claim 28, wherein the reaction gas comprises a nitrogen-containing aromatic compound and the electricity is discharged at not less than 2000 V.

38. An amorphous carbon film forming process for forming the amorphous carbon film of claim 17 on a surface of a substrate by plasma CVD, comprising:
placing the substrate in a reaction vessel; introducing, into the reaction vessel, a reaction gas comprising one or more gases selected from the group consisting of a carbocyclic compound gas containing carbon having an $sp^2$ hybrid orbital, and a heterocyclic compound gas containing carbon having an $sp^2$ hybrid orbital and silicon and/or nitrogen; and discharging electricity.

39. The amorphous carbon film forming process of claim 38, wherein a carbocyclic compound of the carbocyclic compound gas is an aromatic hydrocarbon compound.

40. The amorphous carbon film forming process of claim 39, wherein the aromatic hydrocarbon compound is one or more selected from the group consisting of benzene, toluene, xylene and naphthalene.

41. The amorphous carbon film forming process of claim 38, wherein a heterocyclic compound of the heterocyclic compound gas is a nitrogen-containing heterocyclic compound containing nitrogen.

42. The amorphous carbon film forming process of claim 41, wherein the nitrogen-containing heterocyclic compound is one or more selected from the group consisting of pyridine, pyrazine and pyrrole.

43. The amorphous carbon film forming process of claim 38, wherein the substrate has a temperature of not less than 500° C.

44. The amorphous carbon film forming process of claim 43, wherein the substrate has a temperature of not less than 600° C.

45. The amorphous carbon film forming process of claim 38, wherein the electricity is discharged at not less than 1000 V.

46. The amorphous carbon film forming process of claim 45, wherein the electricity is discharged at not less than 2000 V.

47. The amorphous carbon film forming process of claim 38, wherein the reaction gas comprises a nitrogen-containing aromatic compound and the electricity is discharged at not less than 2000 V.

48. An amorphous carbon film, consisting essentially of carbon and hydrogen, wherein the amorphous carbon film contains not more than 30 atomic % (excluding 0 atomic %) of hydrogen and, when the entire amount of the carbon is taken as 100 atomic %, carbon having an $sp^2$ hybrid orbital is present in an amount of not less than 70 atomic % and less than 100 atomic %.

49. An amorphous carbon film, consisting essentially of carbon, hydrogen and silicon, wherein the amorphous carbon film contains not more than 30 atomic % (excluding 0 atomic %) of hydrogen and less than 1 atomic % (excluding 0 atomic %) of silicon and, when the entire amount of the carbon is taken as 100 atomic %, carbon having an $sp^2$ hybrid orbital is present in an amount of not less than 70 atomic % and less than 100 atomic %.

50. An amorphous carbon film forming process for forming the amorphous carbon film of claim 2 on a surface of a substrate by plasma CVC, comprising:
   placing the substrate in a reaction vessel;
   introducing, into the reaction vessel, a reaction gas comprising one or more gases selected from the group consisting of a carbocyclic compound gas containing carbon having an $sp^2$ hybrid orbital, and a nitrogen-containing heterocyclic compound gas containing carbon having an $sp^2$ hybrid orbital and nitrogen; and
   discharging electricity.

* * * * *